US008888918B2

(12) United States Patent
Guo et al.

(10) Patent No.: US 8,888,918 B2
(45) Date of Patent: Nov. 18, 2014

(54) VAPOR COLLECTION

(75) Inventors: Qian Guo, Fremont, CA (US); Mark Smura, Palo Alto, CA (US); Michael Joseph Stirniman, Fremont, CA (US); Hamid Riahi Samani, Los Altos, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/077,649

(22) Filed: Mar. 31, 2011

(65) Prior Publication Data

US 2012/0251720 A1 Oct. 4, 2012

(51) Int. Cl.
*C23C 16/00* (2006.01)
*C23C 14/56* (2006.01)

(52) U.S. Cl.
CPC .................. *C23C 14/564* (2013.01)
USPC .......................... 118/726; 118/727

(58) Field of Classification Search
CPC ................................... C23C 14/564
USPC ........................... 118/726, 727
See application file for complete search history.

(56) References Cited

U.S. PATENT DOCUMENTS

| 3,861,353 | A | * | 1/1975 | Erhart et al. | 118/725 |
| 4,700,660 | A | * | 10/1987 | Levchenko et al. | 118/726 |
| 5,776,250 | A | * | 7/1998 | Shin et al. | 118/326 |
| 6,183,831 | B1 | * | 2/2001 | Hughes et al. | 428/833.6 |
| 2002/0069970 | A1 | * | 6/2002 | Noorbakhsh et al. | 156/345.37 |
| 2003/0185977 | A1 | | 10/2003 | Kalynushkin | |
| 2009/0047417 | A1 | * | 2/2009 | Barnes et al. | 427/9 |

FOREIGN PATENT DOCUMENTS

DE 10022159 11/2001
WO WO 2006/042575 4/2006

OTHER PUBLICATIONS

English translation, DE 10022159, Thaler, Nov. 2001.*
Search Report and Writen Opinion issued Jul. 11, 2013 in Singapore, Patent Application No. 201201120-1, filed Feb. 17, 2012.

* cited by examiner

*Primary Examiner* — Keath Chen
(74) *Attorney, Agent, or Firm* — Mueting, Raasch & Gebhardt, P.A.

(57) ABSTRACT

An apparatus for collecting condensed vapor during physical vapor deposition includes an enclosure configured to be placed adjacent to one or more vapor sources in a vacuum chamber. The enclosure includes an internal surface of the enclosure partially enclosing a volume of space configured to receive an object wherein the enclosure is maintained at a cooler temperature than the one or more vapor sources. The internal surface of the enclosure is coupled to one or more drainage gutters drainage drainage gutters.

20 Claims, 5 Drawing Sheets

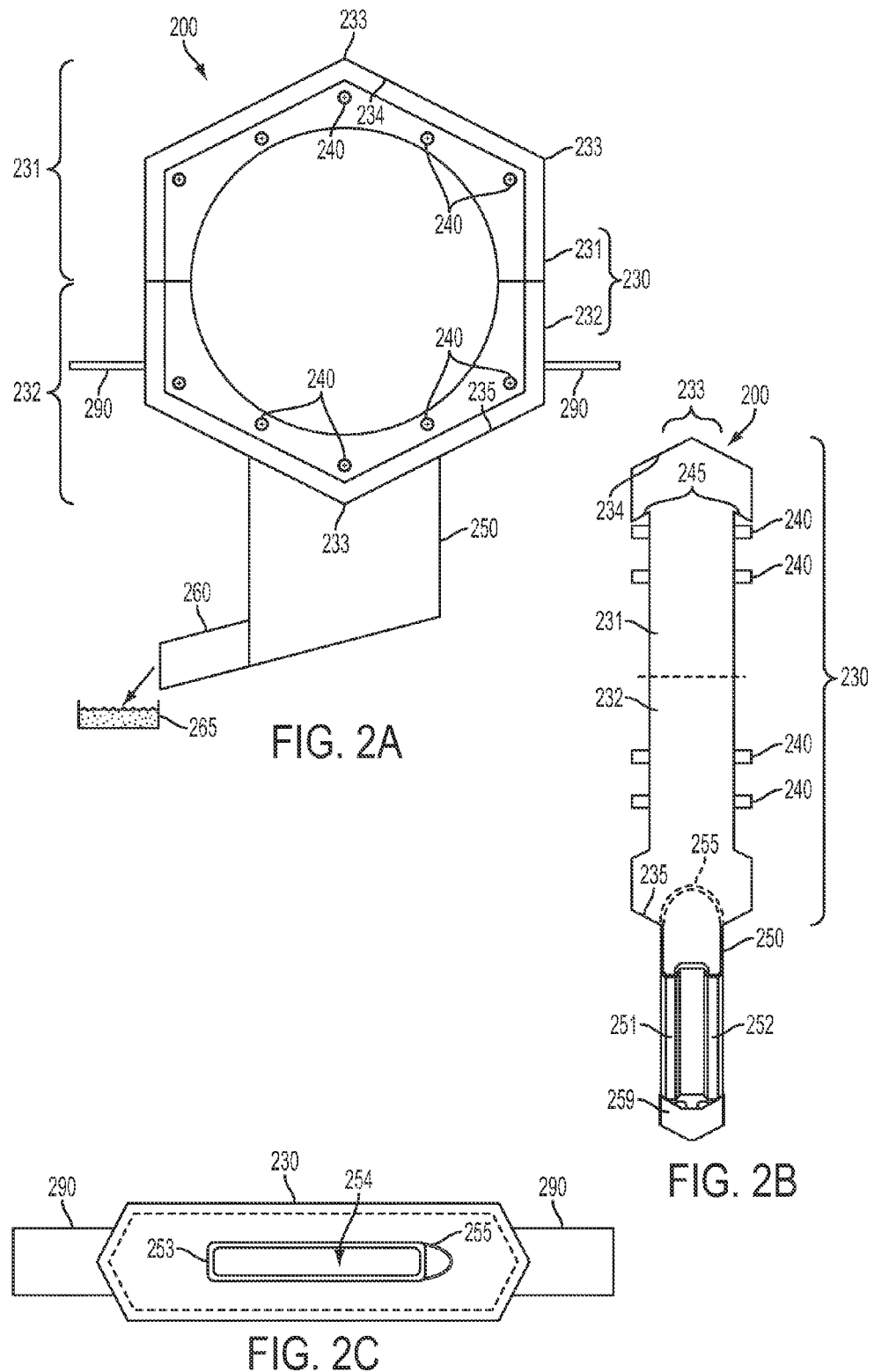

VAPOR COLLECTION

FIELD

This disclosure relates generally to vapor collection, and specifically, to the condensation and collection of vapor.

BACKGROUND

Thin film magnetic and magneto-optical (MO) media in disc form are typically lubricated with a thin film of a polymeric lubricant, e.g., a perfluoropolyether, to reduce wear of the disc when utilized with data/information recording and read-out heads/transducers operating at low flying heights, as in a hard disc system functioning in both contact start-stop ("CSS") and load/unload ("L/UL") modes. Conventionally, a thin film of lubricant is applied to the disc surface(s) during manufacture by dipping a disc with a stack of thin film layers formed thereon, including at least one recording layer, into a bath containing a small amount of lubricant, e.g., less than about 1% by weight of a fluorine-containing polymer, dissolved in a suitable solvent, typically a perfluorocarbon, fluorohydrocarbon, or hydro fluoroether. However, a drawback inherent in such dipping process is the consumption of large quantities of solvent, resulting in increased manufacturing cost and concern with environmental hazards associated with the presence of toxic or otherwise potentially harmful solvent vapors in the workplace.

Vapor deposition of thin film lubricants is an attractive alternative to dip lubrication in view of the above drawbacks. Specifically, vapor deposition of lubricant films is a solvent free process. Moreover, vapor deposition techniques can provide up to about 100% bonded lubricant molecules when utilized with appropriate polymeric lubricants and magnetic and/or MO disc substrates having deposition surfaces comprised of a freshly-deposited carbon-based protective overcoat layer which is not exposed to air prior to lubricant deposition thereon.

SUMMARY

In an aspect of the disclosure, an apparatus for collecting condensed vapor during physical vapor deposition includes an enclosure configured to be placed adjacent to one or more vapor sources in a vacuum chamber. The enclosure includes an internal surface of the enclosure partially enclosing a volume of space configured to receive an object wherein the enclosure is maintained at a cooler temperature than the one or more vapor sources. The internal surface of the enclosure is coupled to one or more drainage gutters drainage drainage gutters.

BRIEF DESCRIPTION OF THE FIGURES

Embodiments of this disclosure are illustrated by way of example and not limitation in the figures of the accompanying drawings, in which like references indicate similar elements, and in which:

FIG. 2A illustrates a side view of an apparatus to contain and condense lubricant vapor in accordance with an embodiment.

FIG. 2B illustrates a front edge view of the apparatus of FIG. 2A.

FIG. 2C illustrates a top edge view of the apparatus of FIG. 2A.

DETAILED DESCRIPTION

Figure 1A:
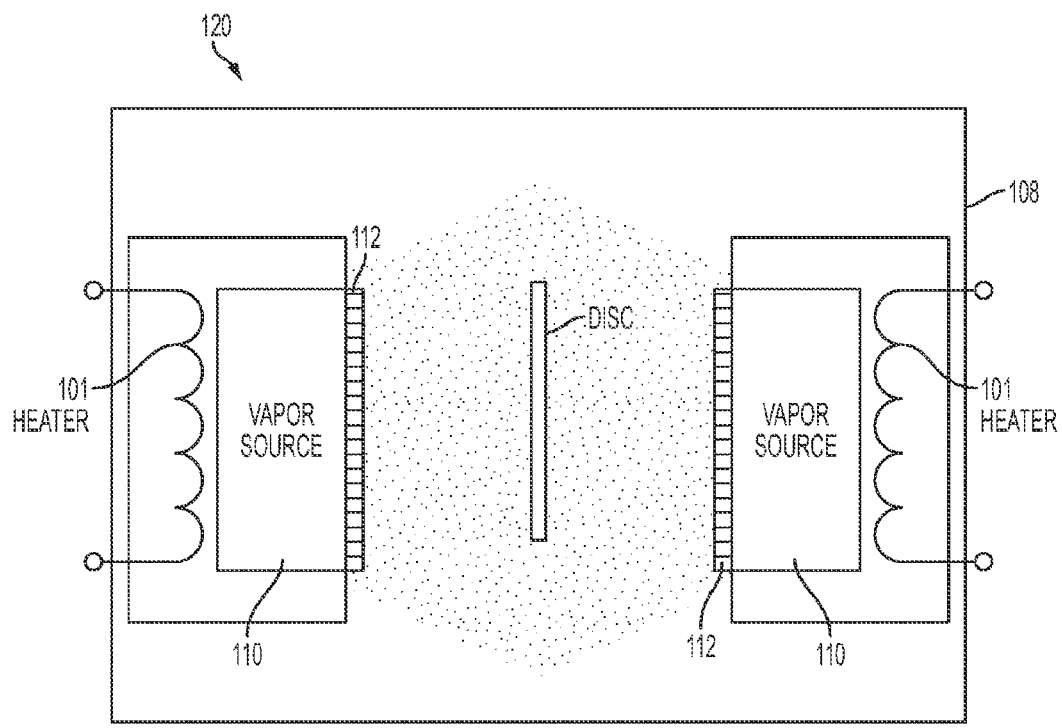
FIG. 1 illustrated an embodiment of a conventional vapor lubrication system configuration.

Referring to FIG. 1A, in a physical vapor deposition process for disc drive media lubricants, a deposition system 120 includes a thermal source 101 heats liquid lubricant in a vapor source 110, both of which are contained in a vacuum chamber 108 to produce a lubricant vapor. The heated lubricant may have a higher vapor pressure than the lubricant at ambient or below ambient temperatures. The lubricant vapor is effused from the vapor source 110 through an array of holes in a heated diffuser plate 112 to a space in the vacuum chamber 108 where an unheated object may be coated with the lubricant. The vapor travels across a gap under vacuum conditions and condenses on the unheated object surface which, for example, may be a disc. In one embodiment, the disc may be exposed to the effused vapor from one side by a single heated vapor source 110. In another embodiment, the disc may be exposed from both sides, using two heated vapor sources. The diffuser plate 112 is is provided to produce a spatially uniform film across the surface of the disc. While the array of holes and the gap between the vapor source 110 and the disc are designed to maximize line-of-sight deposition of the vapor, the effusive nature of the vapor through the holes in the diffuser plate 112 results in a significant amount of lubricant that is not deposited on the disc surface. This unused lubricant may conventionally condense on walls of the vacuum chamber 108 or be removed by a pumping system coupled to the vacuum chamber 108. In either case, the lubricant is not utilized on the disc and is considered lost. In addition to the added costs due to unutilized lubricant, lubricant condensed inside the vacuum chamber 108 or system pumps can have other detrimental effects, such as premature pump failure.

Figure 1B:
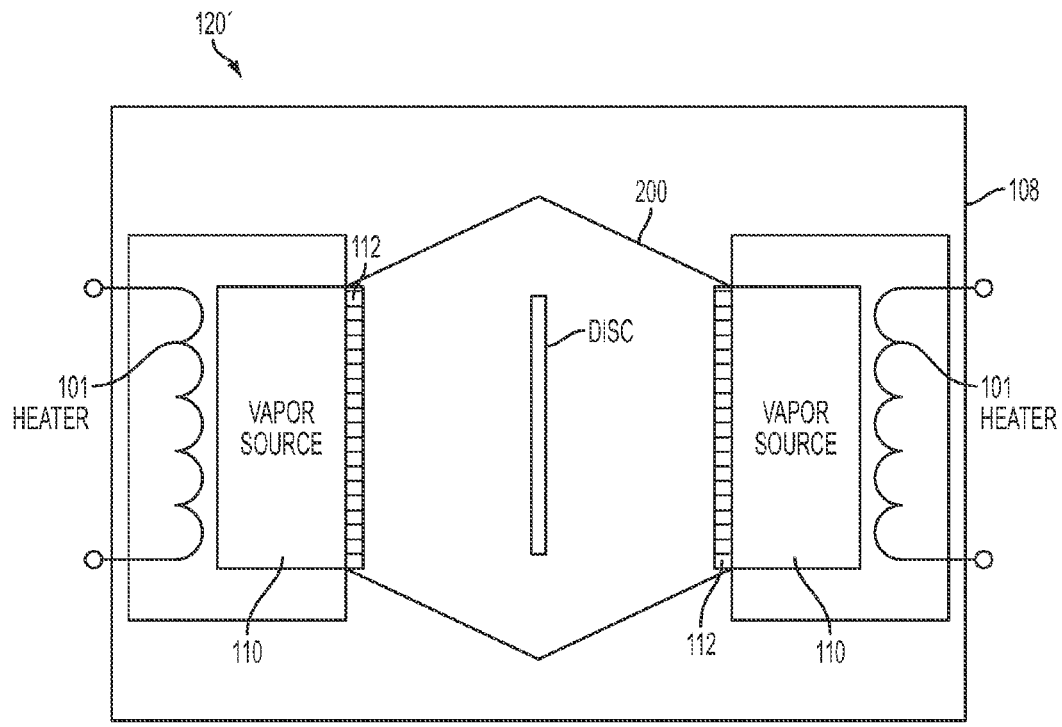

Referring to FIG. 1B, a physical vapor deposition process for disc drive media lubricants, a deposition system 120' may include some or all of the elements of the deposition system 120, but further includes an enclosure 200. Details of the enclosure 200 are described below.

FIG. 2A is a front-view of apparatus 200 to contain and collect lubricant vapor that would otherwise be deposited on interior walls of the vacuum chamber 108 containing the apparatus 200. In an embodiment, the apparatus 200 is configured to be placed opposite one or more vapor sources 110, the vapor sources 110 substantially facing opposite sides of an object which, for example, may be a disc, such as a magnetic memory disc or a magneto-optical disc. In an embodiment, two vapor sources 110 face each other, with the disc in between the two vapor sources 110. The apparatus 200 includes an enclosure 230 that may enclose a space between the two vapor sources 110 containing the disc. The low thermal conductivity of the spacers 240 may prevent or retard the heat of the vapor source 110 from heating the enclosure 230. To enable more efficient condensation of the vapor, thermally insulating spacers 240 may mechanically couple either side of the enclosure 230 to a corresponding vapor source 110 while providing a measure of thermal isolation of the enclosure 230 from the hot vapor sources 110, and maintaining a restricted gap to reduce the amount of vapor lubricant that may undesirably enter the enclosure 230.

By maintaining a larger temperature differential between the hotter vapor source 110 and the cooler enclosure 230, the rate of vapor condensation on the enclosure is made greater. Ceramics and some metals are known to have low thermal conductivity. For example, alumina and other ceramics have thermal conductivity in the approximate range of 10-50 W/m-° K. Certain stainless steels, such as 316 and 316L have thermal conductivities on the order of 15-30 W/m-° K, and Inconel™ has a thermal conductivity on the order of about 15-20 W/m-° K. Such materials may be characterized as having low thermal conductivity. For comparison, aluminum metal has a high thermal conductivity on the order of about 200 W/m-° K.

The enclosure 230 may have a generally polygonal, oval, circular or similar shape that includes an upper shield 231 and a lower shield 232. Each shield includes an arched-shaped surface 234 where the apex of the arch is approximately in-line and concentric with a planar surface of the disc and forms a substantially outermost boundary of the shields 231, 232 with respect to the center of the disc. In the upper shield 231, condensed vapor may flow downwards and away from the plane of the disc by the action of gravity along an inner surface of the shield 231 so that condensed vapor may not drip onto the disc. In the lower shield 232 the arch acts as a trough in which condensed vapor may flow downwards by the action of gravity, substantially collecting below the disc. At least the upper shield 231 also includes drainage gutters 245 at each "foot" of the arch surface 234 to capture condensed vapor as it flows downward to prevent it from potentially running over the diffuser plate 112 of the vapor source 110, to avoid condensed vapor dripping on the disc, and further to avoid condensed vapor dripping out of the enclosure 230. A drain 250 coupled to the lower shield 232 directs the condensed vapor to a reservoir 265 for storage. The stored condensed vapor may be re-used in subsequent vapor deposition. Alternatively, the stored condensed vapor may be continuously recycled to the vapor source 110 for possible immediate re-use.

Because the vapor pressure may be quite low at ambient temperature (e.g., room temperature) or lower temperature, increasing the temperature differential between the vapor source 110 and the enclosure 230 by lowering the temperature of the enclosure may provide an increased condensation efficiency, and reduce an amount of the vapor that may accumulate in parts of the vacuum chamber 108 or pumping system. Therefore, a one or more cooling plates 290 having high thermal conductivity may be arranged with the enclosure 230 to provide additional sub-ambient cooling transfer of heat away from the enclosure 230 and greater temperature differential between the enclosure 230 and the vapor source 110. Sub-ambient cooling may be accomplished with several different structures, including coupling the cooling plates 290 to heat dissipation fins (not shown) external to the vacuum chamber 108, Peltier coolers (not shown), fluid heat transfer apparatus (not shown), or the like.

A small narrow throat aperture 254 at a bottom of the enclosure 230 shield 232 may provide for insertion and removal of the disc for the deposition process. The aperture 254 may be kept to minimum dimensions to allow for insertion and removal of the disc while reducing an amount of vapor that may escape the enclosure to reach the walls of the vacuum chamber or the pumping system.

The enclosure 230 may be constructed of a material having a low rate of oxidation. In addition, a low thermal conductivity material, such as stainless steel 316, 16L and Inconel™, or the like, may reduce heating of the enclosure 230, thereby maintaining a higher rate of condensation of the vapor. A polished internal surface of the enclosure may promote better flow and drainage of the condensed vapor. For the sake of maintaining the chemical stability and purity of the vapor deposited on the disc, or other object, the enclosure material may be selected to have a substantially negligible rate of outgassing, a substantially negligible rate of corrosion, and inertness to chemical reaction with the vapor. A selection of possible materials used to form the enclosure 230 includes various forms of stainless steel and Inconel™, such as stainless steel 316 and 316L, as indicated above, but the selection is not limited to these, provided one or more of the above characteristics can be satisfied.

In another embodiment, a combination of materials may be used from which the enclosure is formed. For example, whereas the body of the enclosure 230 may be formed of one material for thermal characteristics, strength, etc., a deposited material on the interior surface may be selected for surface properties that may be beneficial. For example, the interior surface of the enclosure 230 may be electroplated with a selected material that is chemically non-reactive or non-corrosive or, alternatively, Teflon™ may be formed on the interior surface which may provide a chemically inert surface or a surface conducive to mobility and drainage of the condensed vapor, because Teflon™ has non-sticking properties.

As a consequence of the arch 233 shape of the enclosure 230 also in the lower shield 232, condensed vapor drains down an inner surface 234 of the shield 231 along the drainage gutter 245 and inwardly towards the arch 233 of the lower shield 232, where the arch 233 is now inverted, for example, with respect to the upper shield 231. A drain 250 coupled to a lower portion of the lower shield 232 guides the condensed vapor from the inward sloping inner surface 235 of the lower shield 232 to an exit 255 from the enclosure 230. The drain 250 has a split structure; that is, the drain splits into two guttered drains 251 and 252, with an aperture 254 between to permit the disc to be inserted into the enclosure 230 to be exposed to the diffuser plates 112 of the vapor source 110, and afterwards removed.

The two drains 251 and 252 are guttered to prevent condensed vapor from draining into the aperture through which the disc passes, and therefrom into the vacuum pumping system. A small narrow throat aperture 254 at a bottom of the enclosure 230 may provide for insertion and removal of the disc for the deposition process. The aperture 254 may be kept to minimum dimension to allow for insertion and removal of the disc while reducing an amount of vapor that may escape the enclosure to reach the walls of the vacuum chamber or the pumping system. The two drains 251 and 252 converged at an exit 259 coupled to a trough 260 that guides the condensed vapor downward to a reservoir 265.

The stored condensed vapor may be re-used in subsequent vapor deposition. Alternatively, the stored condensed vapor may be recycled from the reservoir 265 to the vapor source 110 for substantially immediate re-use.

Figure 3:
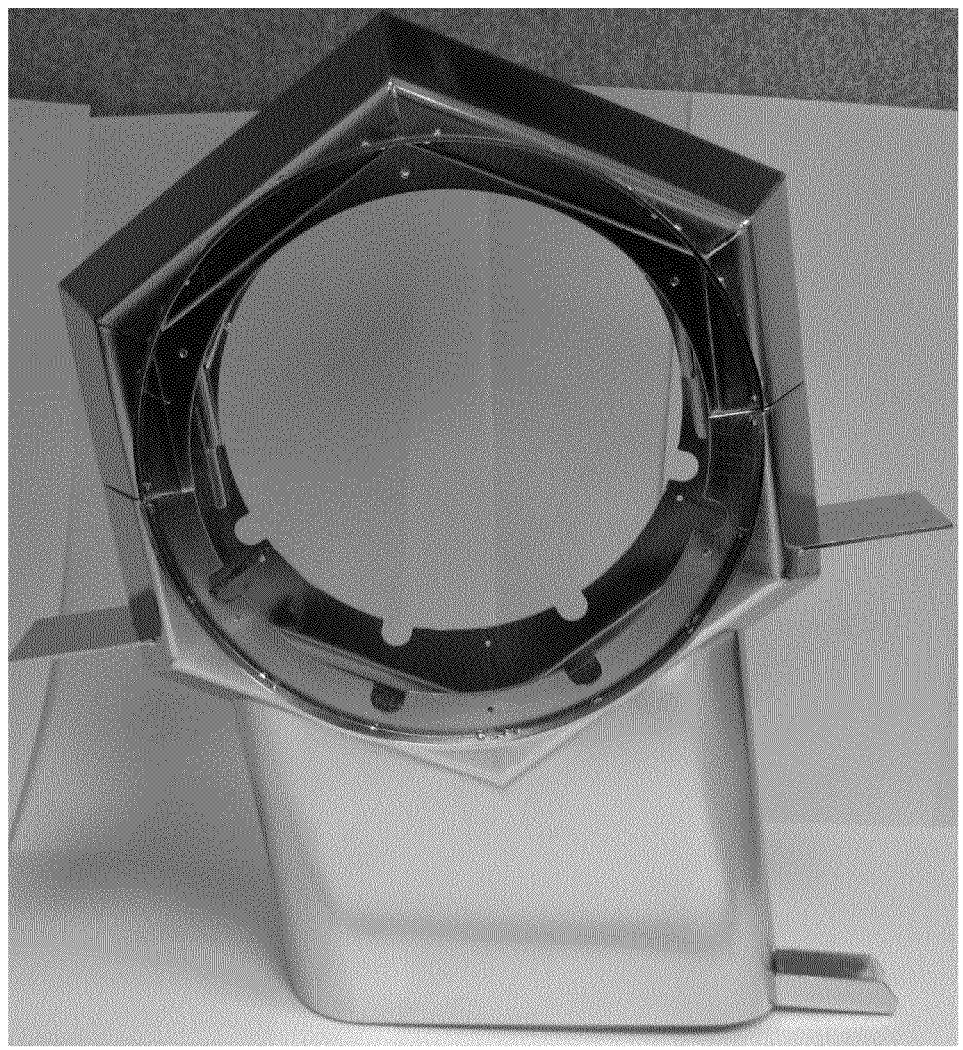
FIG. 3 shows a photograph of an exemplary apparatus.
Figure 4A:
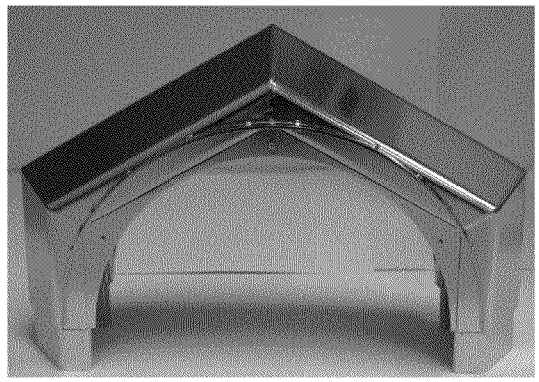
FIGS. 4A, 4B, and 4C show photographs from different perspectives of the shield portion of the exemplary apparatus of FIG. 3.
Figure 4B:
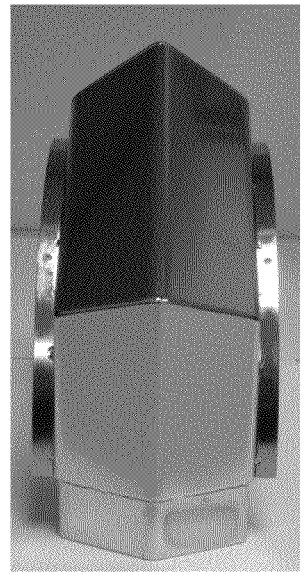
Figure 4C:
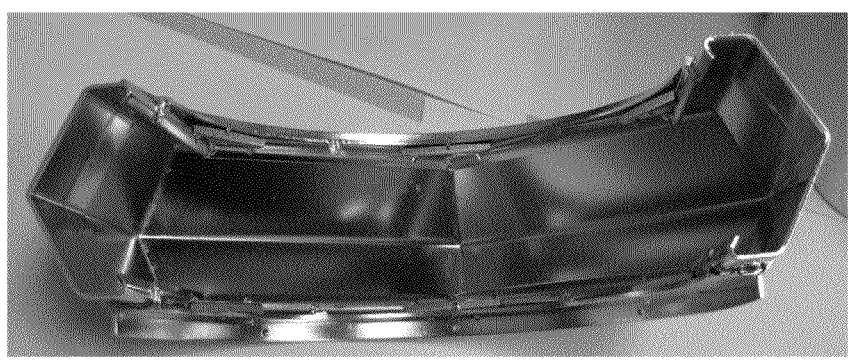
Figure 5A:
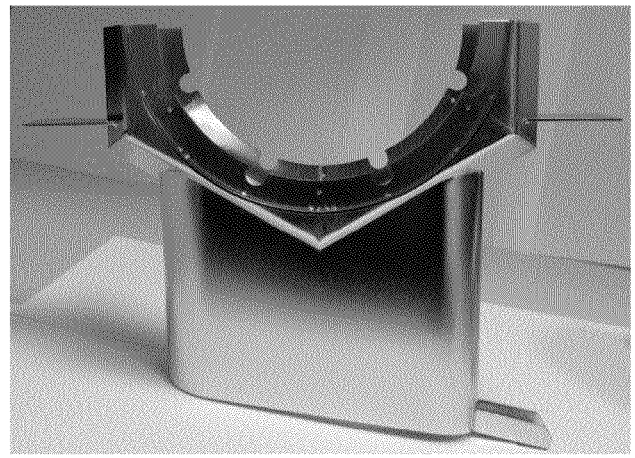
FIGS. 5A and 5B show photographs from different perspectives of the lower shield portion of the exemplary apparatus of FIG. 3.
Figure 5B:

FIG. 3 is a photograph of an exemplary apparatus described herein. FIGS. 4A, 4B and 4C are photographs of the shield portion (i.e., the top portion of the apparatus, referred to as 231 in FIG. 2) of the exemplary apparatus. FIGS. 5A and 5B are photographs of the lower shield portion (i.e., the portion referred to as 232 in FIG. 2) of the exemplary apparatus.

It is to be understood that even though numerous characteristics of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application system while maintaining substantially the same functionality without departing from the scope and spirit of the present invention. In addition, although the preferred embodiment described herein is directed to a particular set of manifolds with orifices for controlled introduction of gas into a vacuum chamber, it will be appreciated by those skilled in the art that the teachings of the present invention can be applied to other gas handling systems without departing from the scope and spirit of the present invention.

The embodiments described herein thus provides a number of features not included in conventional static vapor deposition apparatus and methodology, and is of particular utility in automated manufacturing processing of thin film magnetic and MO recording media including deposition of uniform thickness lubricant topcoat layers for obtaining optimized tribological properties. Specifically, the embodiments described herein provide for recovery of lubricant and re-use of the recovered lubricant, which may result in a reduction of manufacturing costs arising from use of the lubricant. Further, the embodiments described herein can be readily utilized as part of conventional manufacturing apparatus/technology in view of their full compatibility with all other aspects of automated manufacture of magnetic and MO media. Furthermore, the embodiments described herein are broadly applicable to a variety of vapor deposition processes utilized in the manufacture of a number of different products, e.g., mechanical parts, gears, linkages, etc., using lubrication. Finally, the embodiments described herein are broadly applicable to a variety of vapor deposition processes where the ambient temperature vapor pressure is lower than the vapor pressure at elevated temperatures.

The various aspects presented throughout this disclosure are provided to enable one of ordinary skill in the art to make and use the present composition. Various changes, alterations, and modifications to the compounds and apparatus presented throughout this disclosure will be readily apparent to those skilled in the art, and the concepts disclosed herein may be extended to other compounds and apparatus. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus for collecting condensed vapor during physical vapor deposition comprising:
   a vacuum chamber;
   at least two vapor sources; and
   an enclosure inside the vacuum chamber in a vertical position maintained at a temperature cooler than the at least two vapor sources, the at least two vapor sources being in a vertical position, the enclosure comprising:
   an internal surface partially enclosing a volume of space, the space configured to receive an object, wherein the object is a disc; and
   one or more drainage gutters coupled to the internal surface of the enclosure,
   wherein the at least two vapor sources are positioned adjacent opposite sides of the enclosure.

2. The apparatus of claim 1, further comprising one or more thermally insulating spacers between each of the at least two vapor sources and the enclosure.

3. The apparatus of claim 2, wherein the thermally insulating spacers comprise a low thermal conductivity ceramic.

4. The apparatus of claim 2, wherein the one or more thermally insulating spacers comprise a plurality of posts having low thermal conductivity and wherein the posts cause the enclosure to be spaced apart from the at least two vapor sources.

5. The apparatus of claim 1, further comprising one or more thermally conductive plates coupled to the enclosure, wherein heat is conducted from the enclosure via the conductive plates.

6. The apparatus of claim 1, the enclosure further comprising an upper shield and a lower shield, wherein each shield has an inner surface shaped to guide condensed vapor away from the object.

7. The apparatus of claim 6, wherein a size of the upper shield inner surface is equal or less than a size of the inner surface of the lower shield at the interface between the upper shield and the lower shield.

8. The apparatus of claim 6, further comprising an upper shield gutter configured to guide condensed vapor from the inner surface of the upper shield away from the object and the at least two vapor sources.

9. The apparatus of claim 6, further comprising a downward sloping drain gutter coupled to the lower shield.

10. The apparatus of claim 9, wherein the downward sloping drain gutter comprises a split channel gutter having an aperture to accommodate the object to pass into and from the enclosure.

11. The apparatus of claim 9, further comprising a reservoir to receive the condensed vapor from the downward sloping drain gutter.

12. The apparatus of claim 9, further comprising an aperture between the split channel drainage gutters in the enclosure to permit insertion and removal of the object while reducing an amount of vapor that may escape from the enclosure.

13. The apparatus of claim 1, wherein the vapor comprises a lubricant.

14. The apparatus of claim 1, wherein the enclosure is comprised of a material having at least one of less than a specified maximum rate of oxidation, less than a maximum specified thermal conductivity, a polished internal surface, less than a specified maximum rate of out-gassing, less than a specified maximum rate of corrosion, and a specified chemical inertness to the vapor.

15. The apparatus of claim 14, wherein the enclosure material comprises stainless steel.

16. A vacuum system configured for collecting condensed vapor during physical vapor deposition comprising:
   a chamber configured to be coupled to a vacuum pumping system;
   at least two vapor sources within the chamber, the at least two vapor sources in a vertical position;
   an enclosure placed between to the at least two vapor sources, the enclosure comprising:

an internal surface substantially enclosing a volume of space, the space configured to receive an object, wherein the object comprises a disc; and one or more drainage gutters coupled to the internal surface of the enclosure.

17. The system of claim 16, further comprising one or more thermally insulating spacers between each of the at least two vapor sources and the enclosure.

18. The system of claim 16, the enclosure further comprising an inner surface shaped to guide condensed vapor away from the object.

19. The system of claim 16, further comprising one or more thermally conductive plates coupled to the enclosure, wherein heat is conducted from the enclosure via the conductive plates.

20. The system of claim 16, wherein the at least two vapor sources are configured with at least two heaters and the vapor sources and the heaters are located within the chamber.

* * * * *